US012081014B2

(12) United States Patent
Heglund

(10) Patent No.: US 12,081,014 B2
(45) Date of Patent: Sep. 3, 2024

(54) FAULT CLEARING IN MIDPOINT GROUNDED SYSTEMS

(71) Applicant: Hamilton Sundstrand Corporation, Charlotte, NC (US)

(72) Inventor: William S. Heglund, Rockford, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 799 days.

(21) Appl. No.: 17/132,521

(22) Filed: Dec. 23, 2020

(65) Prior Publication Data
US 2022/0200477 A1 Jun. 23, 2022

(51) Int. Cl.
H02H 7/06 (2006.01)
G01R 31/50 (2020.01)
H02H 3/16 (2006.01)

(52) U.S. Cl.
CPC ............... *H02H 7/06* (2013.01); *G01R 31/50* (2020.01); *H02H 3/16* (2013.01)

(58) Field of Classification Search
CPC .......... H02H 7/06; H02H 7/062; H02H 7/065; H02H 3/16; H02H 3/162; H02H 3/165; H02H 3/167; H02H 3/202; G01R 31/50; G01R 31/52; G01R 31/55
See application file for complete search history.

(56) References Cited

U.S. PATENT DOCUMENTS

| | | |
|---|---|---|
| 5,764,064 A | 6/1998 | Eriksson et al. |
| 6,366,208 B1 | 4/2002 | Hopkins et al. |
| 6,525,914 B1 * | 2/2003 | Legatti ................... H02H 3/334 361/42 |
| 8,149,551 B2 | 4/2012 | Vedulla et al. |
| 8,531,804 B2 | 9/2013 | Weems, II et al. |
| 8,564,914 B2 | 10/2013 | Eisenhauer et al. |
| 8,698,504 B2 | 4/2014 | Wei et al. |
| 8,830,647 B2 | 9/2014 | Chen et al. |
| 9,368,957 B2 | 6/2016 | Prisse et al. |
| 9,612,269 B2 | 4/2017 | Wei et al. |
| 9,859,085 B2 | 1/2018 | Rozman et al. |

(Continued)

FOREIGN PATENT DOCUMENTS

GB 2569185 A 6/2019

OTHER PUBLICATIONS

European Search Report for Application No. 21209581.4, mailed May 13, 2022, 6 pages.

*Primary Examiner* — Nguyen Tran
(74) *Attorney, Agent, or Firm* — CANTOR COLBURN LLP

(57) ABSTRACT

A power supply system to provide power to a load connected between first and second connectors. The system includes a generator that produces an alternating current generator output and a rectifier that receives the alternating current generator output and converts it into a direct current output and provides the direct current (DC) output between the first and second connectors. The system also includes a filter connected to the rectifier and between the connectors and that smooths the DC output. The filter includes a midpoint configured to be connected to ground. The system also includes a fault clearing source connected to the first connector that provides a clearing voltage to the first connector when a ground fault occurs on the first connector.

10 Claims, 6 Drawing Sheets

(56) References Cited

U.S. PATENT DOCUMENTS

| | | |
|---|---|---|
| 10,243,355 B2 | 3/2019 | Armstrong et al. |
| 10,569,895 B2 | 2/2020 | Handy |
| 10,585,134 B2 | 3/2020 | Kell et al. |
| 10,700,514 B2 | 6/2020 | Whitehouse et al. |
| 10,965,123 B1 | 3/2021 | Jia et al. |
| 2007/0086125 A1 | 4/2007 | Baker |
| 2010/0177452 A1* | 7/2010 | Wei ............... H02P 27/06 361/111 |
| 2017/0063074 A1 | 3/2017 | Yasusaka et al. |
| 2019/0079129 A1 | 3/2019 | Valdes |
| 2019/0184833 A1 | 6/2019 | Elshaer et al. |
| 2020/0144807 A1 | 5/2020 | Garrison et al. |
| 2023/0144976 A1 | 5/2023 | Utecht et al. |
| 2023/0231504 A1 | 7/2023 | Kaliyannan et al. |
| 2023/0234448 A1 | 7/2023 | Kumar et al. |

\* cited by examiner

FAULT CLEARING IN MIDPOINT GROUNDED SYSTEMS

BACKGROUND

The subject matter disclosed herein generally relates to clearing ground faults and, more particularly, fault clearing for a midpoint grounded electrical systems that can be employed in airborne applications.

In typical electrical power generation and distribution systems, the protection of the wiring, as well as connected equipment, is needed in the event of a fault such as a ground fault. An aircraft is one illustrative example of an application for such systems.

For aircraft systems, electrical energy is essential for continued flight when relying on electrical flight controls, and is also flight critical for electrically driven hydraulic pumps. Aircraft power systems may use a variety of power characteristics including AC (Alternating Current) or DC (Direct current) systems. Further typical variations of power types may include power sources, loads and distribution of nominal voltages including, but not limited to 28 Vdc, 270 Vdc, or 540 Vdc and 26 Vac, 115 Vac, and 230 Vac.

The AC system types may also include Constant Frequency (CF), or Variable Frequency (VF) systems with a wide variation in output current and power ratings. Severe wiring or internal faults within these systems and within power distribution equipment panels or wiring may cause loss of power to these flight critical systems. Protective functions and assemblies within the power distribution systems improve flight safety by preventing or minimizing the effect of system or wiring faults. Rapid detection and isolation, as well as segregation, of ground circuit faults are desirable due to the localized heating and damage that high current or arcs may cause.

BRIEF DESCRIPTION

According to one embodiment, a power supply system to provide power to a load connected between first and second connectors is disclosed. The system includes a generator that produces an alternating current generator output and a rectifier that receives the alternating current generator output and converts it into a direct current output and provides the direct current (DC) output between the first and second connectors. The system also includes a filter connected to the rectifier and between the connectors and that smooths the DC output. The filter includes a midpoint configured to be connected to ground. The system also includes a fault clearing source connected to the first connector that provides a clearing voltage to the first connector when a ground fault occurs on the first connector.

Additionally or alternatively, in this or other embodiments the fault clearing source is a battery.

Additionally or alternatively, in this or other embodiments the fault clearing source receives power from the second connector.

Additionally or alternatively, in this or other embodiments, the system also includes a current blocking device connected between the fault clearing source and the first connector, the current blocking device blocking a flow of current from the fault clearing source to the first connector before the ground fault occurs.

Additionally or alternatively, in this or other embodiments the current blocking device is a diode.

Additionally or alternatively, in this or other embodiments the system further includes a contactor connected to the first connector that can open and close to clear the fault while the fault clearing source is providing the clearing voltage to the first contactor.

Additionally or alternatively, in this or other embodiments the output filter includes two capacitors and the midpoint is between the two capacitors.

Additionally or alternatively, in this or other embodiments the ground is external to the generator.

Additionally or alternatively, in this or other embodiments the ground is an airframe ground.

According to one embodiment, a power supply system to provide power to a load connected between first and second connectors is disclosed. The system includes a generator that produces an alternating current generator output and a rectifier that receives the alternating current generator output and converts it into a direct current output and provides the direct current (DC) output between the first and second connectors. The system also includes a filter connected to the rectifier and between the connectors and that smooths the DC output, the filter including a midpoint configured to be connected to ground. The system further includes a first fault clearing source connected to the first connector that provides a first clearing voltage to the first connector when a first ground fault occurs on the first connector and a second fault clearing source connected to the second connector that provides a second clearing voltage to the second connector when a ground fault occurs on the second connector.

Additionally or alternatively, in this or other embodiments the first and second fault clearing sources are batteries.

Additionally or alternatively, in this or other embodiments the first fault clearing source receives power from the second connector and the second fault clearing source receives power from the first connector.

Additionally or alternatively, in this or other embodiments the system further includes a first current blocking device connected between the first fault clearing source and the first connector, the first current blocking device blocking a first flow of current from the first fault clearing source to the first connector before the first ground fault occurs on the first connector and a second current blocking device connected between the second fault clearing source and the second connector, the second current blocking device blocking a second flow of current from the second fault clearing source to the second connector before the second ground fault occurs on the second connector.

Additionally or alternatively, in this or other embodiments the first and second current blocking devices are diodes.

Additionally or alternatively, in this or other embodiments the output filter includes two capacitors and the midpoint is between the two capacitors.

Additionally or alternatively, in this or other embodiments the ground is external to the generator.

Additionally or alternatively, in this or other embodiments the ground is an airframe ground.

According to one embodiment, a method of clearing a fault in an aircraft system is disclosed. The system includes: a generator that produces an alternating current generator output; a rectifier that receives the alternating current generator output and converts it into a direct current output and provides the direct current (DC) output between first and second connectors; a filter connected to the rectifier and between the connectors and that smooths the DC output, the filter including a midpoint connected to ground; and a fault clearing source connected to the first connector, The method includes: blocking current from flowing from the fault clearing source onto the first connector in the absence of a ground fault on the first connector; and allowing current to flow from the fault clearing source onto the first connector after a ground fault occurs on the first connector.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION OF THE DRAWINGS

The foregoing and other features, and advantages of the present disclosure are apparent from the following detailed description taken in conjunction with the accompanying drawings in which.

DETAILED DESCRIPTION

Embodiments described herein are directed to a system and method that allows for the provision of current to be used in clearing or otherwise identifying a ground fault in system that has a midpoint grounded system. The system includes a current/voltage source that provides the current when one or more connectors or other elements of a DC power supply experiences a ground fault.

Figure 1:
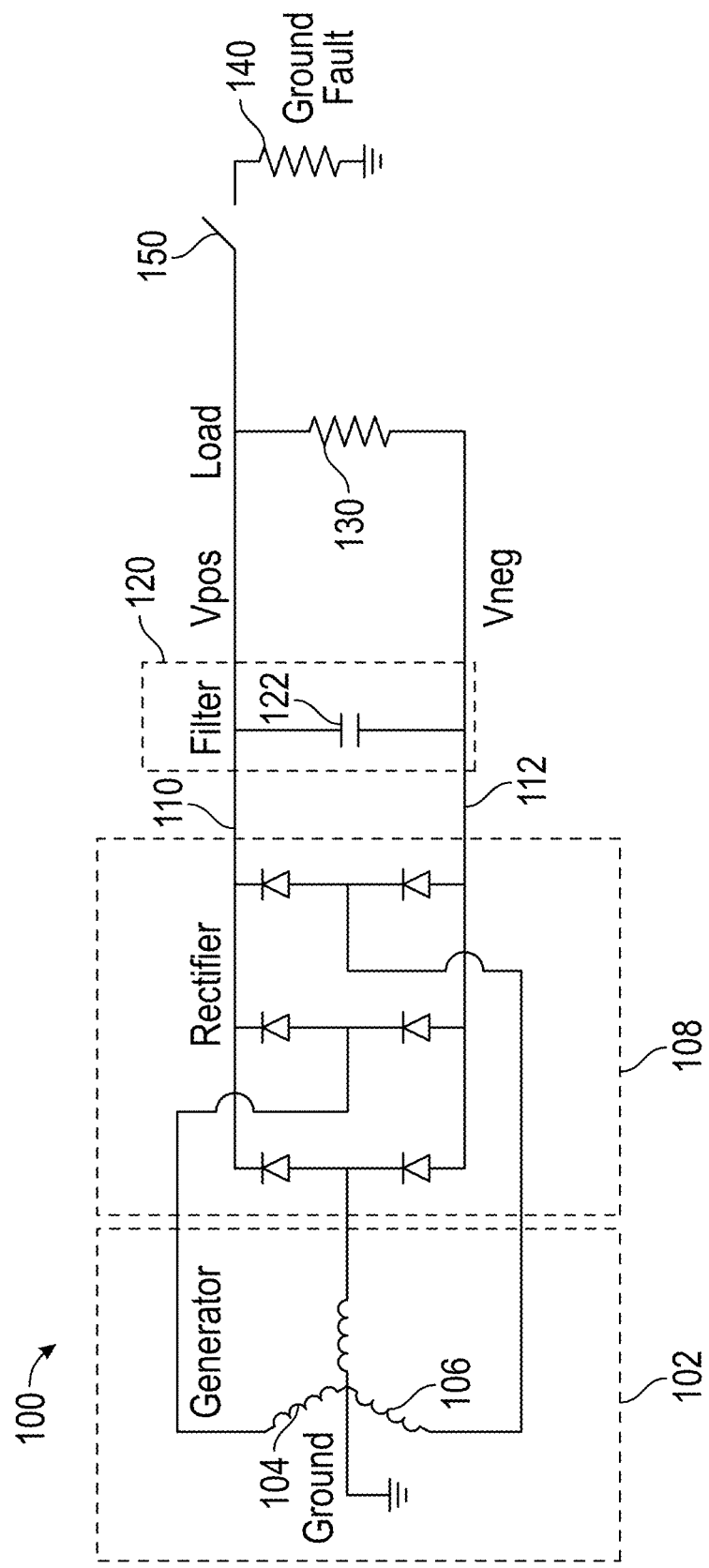
FIG. 1 depicts a system with the generator having its midpoint connected to a system ground.

FIG. 1 shows an example of a generator grounded DC power generation system 100. The system 100 includes a generator 102 (generally shown as stator coils 104). As shown, the coils 104 are connected to one another at a generator neutral 106. As is common in the art, the generator neutral 106 is connected to ground.

The generator 102 produces three phase AC power and is connected to rectifier 108. The rectifier 108 converts the AC power into DC power. The rectifier 108 is shown as a full wave uncontrolled rectifier by the skilled artisan will realize that other types of rectifiers could be utilized in this and other embodiments disclosed herein.

The output of rectifier 108 can generally be described as a DC output and is presented across positive and negative connections 110, 112. The connections can be cables, rails or other means of carrying high voltage current. In FIG. 1, the voltage on these connections is indicated as Vpos and Vneg, respectively.

In some cases, the output of the rectifier 108 is connected to an output filter 120 to smooth the output of the rectifier 108 to provide a smoothed or otherwise more stable output across positive and negative connections 110, 112. As shown, the filter 120 is implemented by an output (or filter) capacitor 122 is connected across the positive and negative rails 110, 112 but other types of filters are possible.

In normal operation, the smoothed output can be provided to a load 130. However, in some instances such as a fault, one or both of the positive and negative rails 110, 112 can be shorted to ground. That possibility is shown graphically by ground fault connection 140. As shown, the connection is illustrated as resistor, but it can be thought of as short in some instances. Such a fault can occur when, for example, the connection 110 has its casing or other production damaged and the currently carrying portion of the connection 110 can be directly connected to ground (e.g., to an airframe of an aircraft). As shown, the fault is occurring on the positive rail but could also or in combination, be on the negative rail as well.

FIGS. 2a-2f shows several graphs of a typical the response of the system of FIG. 1 to a ground fault. Generally, upon sensing the fault, the current to an exciter or other controlling element of the generator to reduce the ground fault current.

Figure 2A:
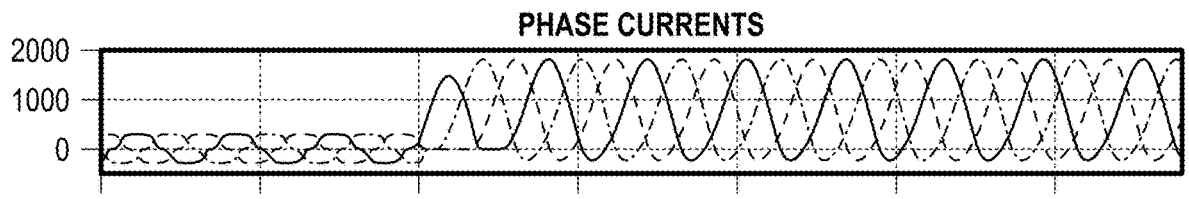
FIGS. 2a-2f show various currents and voltages in the system of FIG. 1 before and after a ground fault occurs in one of the positive DC connectors of the system.
Figure 2B:
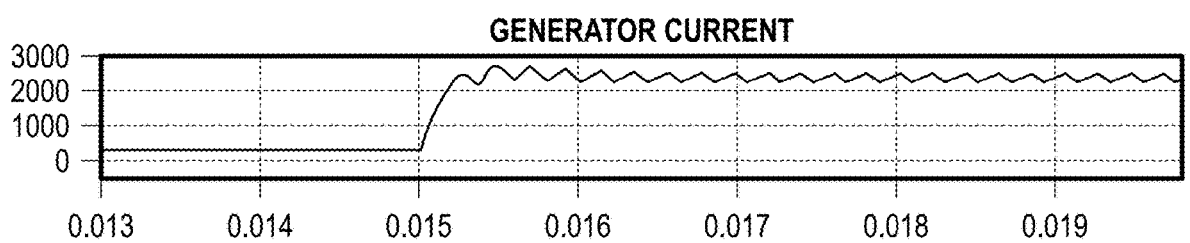
Figure 2C:
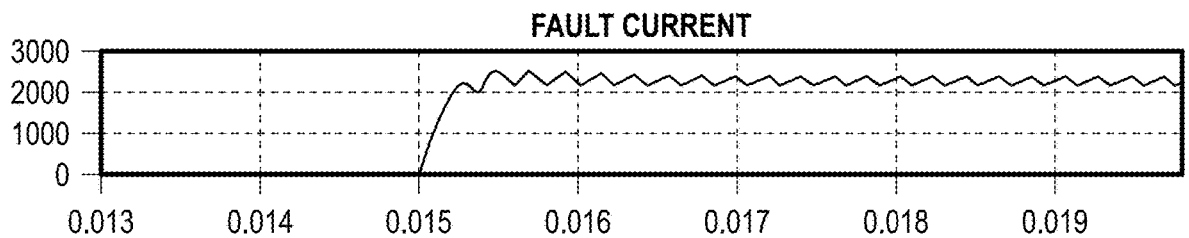
Figure 2D:
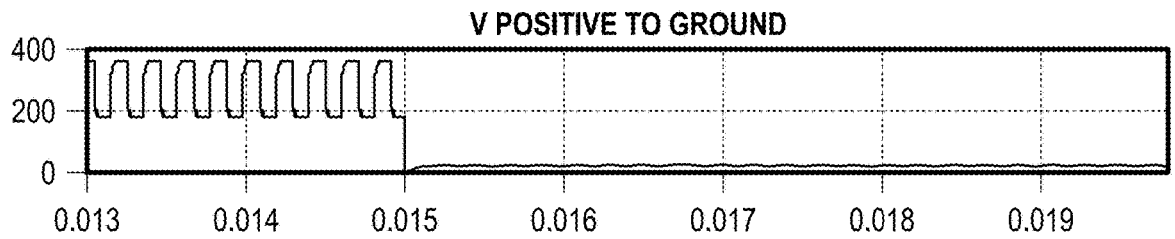
Figure 2E:
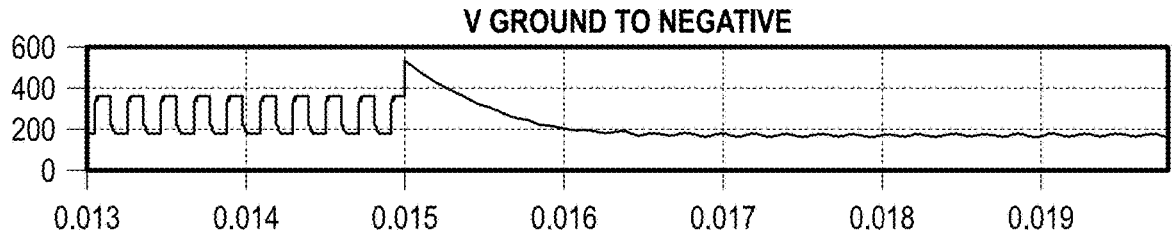
Figure 2F:
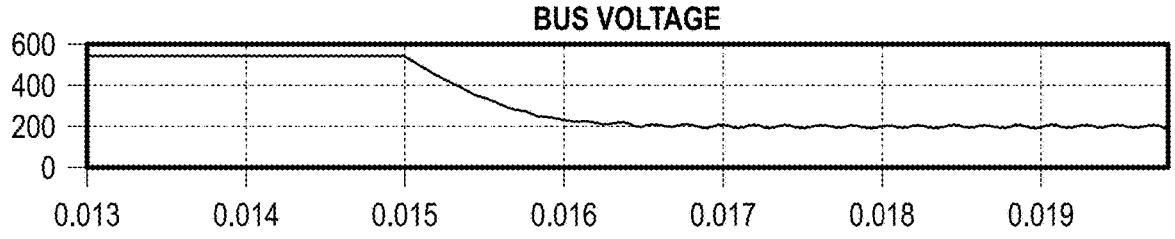

For amplification, note that the fault is modelled to occur at time 0.015 in FIGS. 2a-2f As shown, the generator phase (FIG. 2a) and DC (FIGS. 2b) currents can be very large until the control algorithm adjusts the exciter current to control the ground fault current (FIG. 2c). The common mode voltage for this approach can be relatively large. In the example in FIG. 1 the fault is assumed to be in the positive rail 110 so the voltage thereon falls to almost zero (FIG. 2d) while the ground to negative rail 110 (FIG. 2e) and the negative bus voltage (FIG. 20 collapses to approximately half of the nominal bus voltage for the other loads.

After determining that the fault has occurred, the system 100 can perform a series of tests to determine the location of the fault. In particular, one or more contactors 150 may be opened or closed to determine where along the rails the short has occurred. This determination (or "clearing") requires that current is provided through the rails 110, 112 so that the effect of opening or closing the contactors can be observed. The illustrated contactor 150 is normally closed in normal operation. As shown above, the fact that ground to negative (FIG. 2e) can still support a reduced bus voltage (FIG. 20 between the rails 110, 112, there is a source of current to perform those tests.

This approach results in a system that can meet the required DC voltage transient, voltage ripple and voltage distortion requirements. This approach can also provide the necessary DC fault clearing current.

In some cases, it may be preferable to ground the generator/rectifier to a midpoint of the output filter. Such can exist, for example, in high voltage situations (e.g., 540v Line to line voltage systems).

Figure 3:
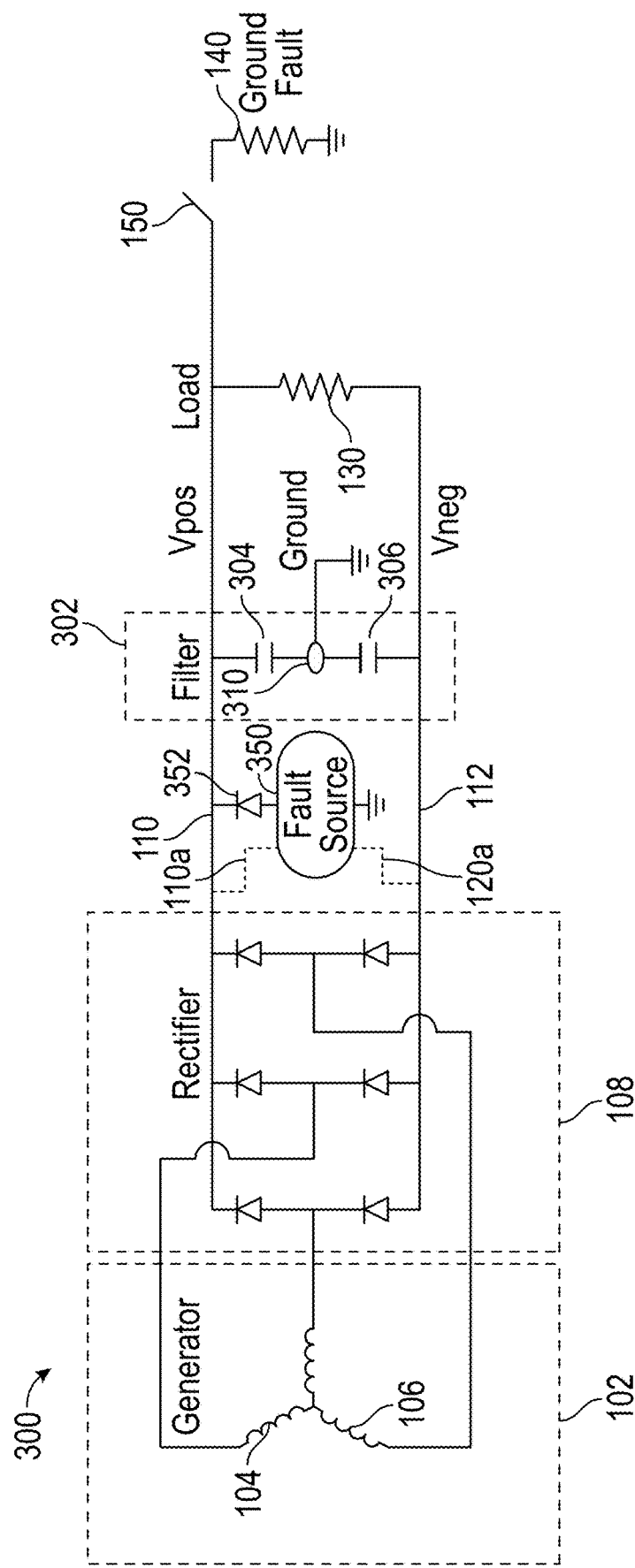
FIG. 3 depicts a system that includes a filter that has its midpoint grounded and includes a fault clearing source according to one embodiment.

An example of such a system 300 is shown in FIG. 3. The system 300 shown in FIG. 3 includes many of the same elements as the system 100. For completeness, a complete description of the circuit in FIG. 3 is now provided and differences between it and the circuit of FIG. 1 are noted. In particular, the generator DC power generation system 300 includes a generator 102 (generally shown as stator coils 104). In contrast, to FIG. 1, while the coils 104 are connected to one another at a generator neutral 106, the generator neutral 106 is not directly connected to ground.

The generator 102 produces three phase AC power and is connected to a rectifier 108. The rectifier 108 converts the AC power into DC power. The rectifier 108 is shown as a full wave uncontrolled rectifier by the skilled artisan will realize that other types of rectifiers could be utilized in this and other embodiments disclosed herein.

The output of rectifier 108 can generally be described as a DC output and is presented across positive and negative connections 110, 112. The connections can be cables, rails or other means of carrying high voltage current as in FIG. 1 and in FIG. 3 the voltage on these connections is indicated as Vpos and Vneg, respectively.

Similar to FIG. 1, in FIG. 3 the output of the rectifier 108 is connected to an output filter 320 to smooth the output of the rectifier 108 to provide a smoothed or otherwise stable output across positive and negative connections 110, 112. As shown, the filter 302 is implemented by two serially connected output capacitors 304, 306 that are connected across the positive and negative rails 110, 112. The midpoint of the output filter 302 (e.g, where capacitors 304, 306 are connected) is shown by node 310 and is connected to ground to create a midpoint connected output filter. The output capacitors 304, 306 include a first output capacitor 304 connected between connector 110 and ground (e.g., between Vpos and ground) and second output capacitor 304 connected between connector 112 and ground (e.g., between Vneg and ground). The ground is outside of the generator 104 is one embodiment. For example, the ground could be an airframe ground of an aircraft.

While a split capacitor output filter is illustrated, it shall be understood that other types of split filter or split bus configurations are possible to create the midpoint/node 310.

In normal operation, the smoothed output can be provided to a load 130. The load can be any element that needs current to operate. For example, the load can be an aircraft actuator in one embodiment. However, as above, in some instances, on or both of the positive and negative rails 110, 112 can be shorted to ground. That possibility is shown graphically by ground fault connection 140. As shown, the connection is illustrated as a resistor, but it can be thought of as short in some instances. Such a fault can occur when, for example, the connection 110 has its casing or other production damaged and the currently carrying portion of the connection 110 can be directly connected to ground (e.g., to an airframe of an aircraft). As shown, the fault is occurring on the positive rail but could also or in combination, be on the negative rail as well.

The circuit also includes a fault current source 350 that is described in more detail below. As will be more fully understood from the below discussion, the fault current source 350 will provide current when a ground fault occurs to allow the system to clear the fault.

Figure 4A:
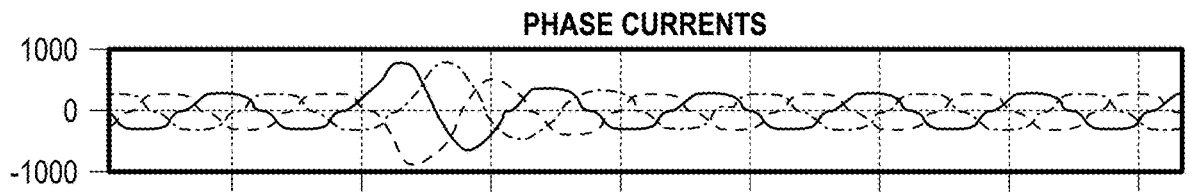
FIGS. 4a-4f show various currents and voltages in the system of FIG. 3 before and after a ground fault occurs in one of the positive DC connectors of the system if the fault clearing source is not present.
Figure 4B:
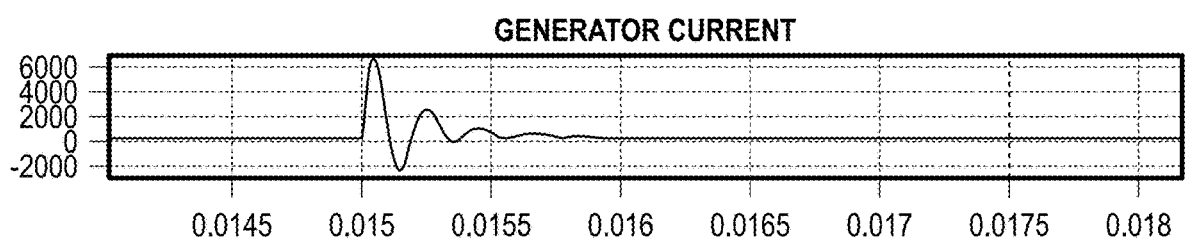

If the fault current source 350 was not present, in the event of short (e.g., the fault 140 is equivalent to a short) the circuit 300 of FIG. 3 should behave as illustrated in FIGS. 4a-4f. When the fault 140 is a "short" (in this case, and 0.015 s) it effectively couples connector 110 to ground. This will result in a rapid rise in current through the fault 140 (FIG. 4c) and results in a rise in current though the coils (FIG. 4a) and the DC current at the output of the rectifier (FIG. 4b).

Figure 4C:
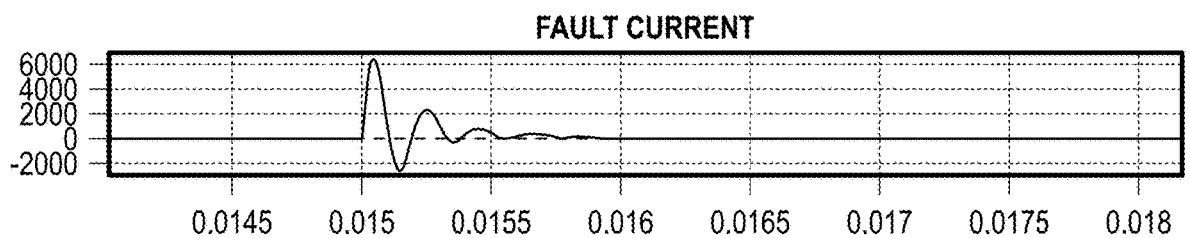
Figure 4D:
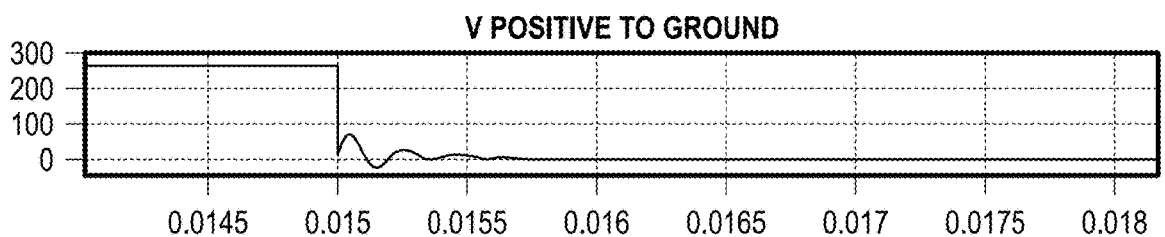

As shown in FIGS. 4c and 4d, the current thought the fault and the voltage from connector 110 (Vpos) to ground will eventually fall to zero after a brief current spike through the fault 140. It is noted that the voltage drop is not instantaneous and is dependent on the discharge time of the first output capacitor 304. After that has discharged, Vpos effectively becomes ground for the system. As such, it cannot provide current to the contactor 150 to clear the fault. In more detail, it is assumed that after the fault occurs, the system will meet the required DC voltage transient, voltage ripple and voltage distortion requirements (see FIGS. 4a-4d). Although this approach can provide a brief surge in the DC current, it is not capable of supplying the sustained current necessary to clear the fault. After the initial current surge, the DC and generator phase currents (FIGS. 4a, 4b) are similar to the values before the fault.

Figure 4E:
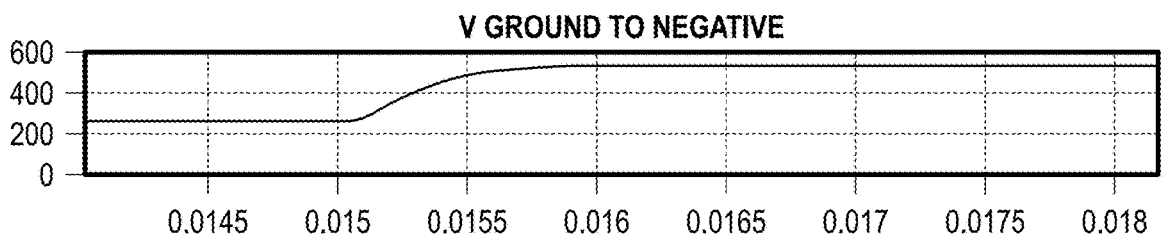
Figure 4F:
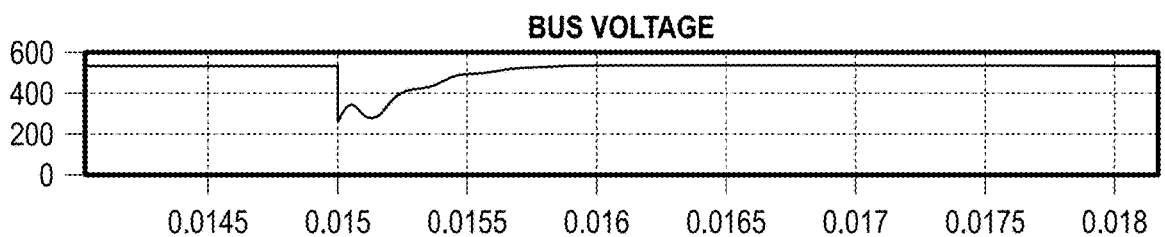

As stated above, after the fault, Vpos becomes ground and, thus, the entire voltage output of the generator is carried between connector 112 (Vneg) and ground as illustrated in FIG. 4e and the bus voltage decreases briefly for the other loads on the bus when the ground fault occurs as shown in FIG. 4f. Of particular note, after steady state has been reached, there is no voltage on Vpos that can allow it to provide the required current to clear the fault.

Embodiments herein include providing one or more current sources that can provide current after a ground fault. To that end, in FIG. 3 the system 300 includes a fault clearing source 350 connected to the first connector 110. A current blocking device 352 can be provided between first fault clearing source 350 and the first connector. The current blocking device 352 is illustrated as a diode in FIG. 3 but other elements could be utilized as long as they allow current to flow from the current blocking device 352 into the connector experiencing the fault (here, connector 110).

Figure 5A:
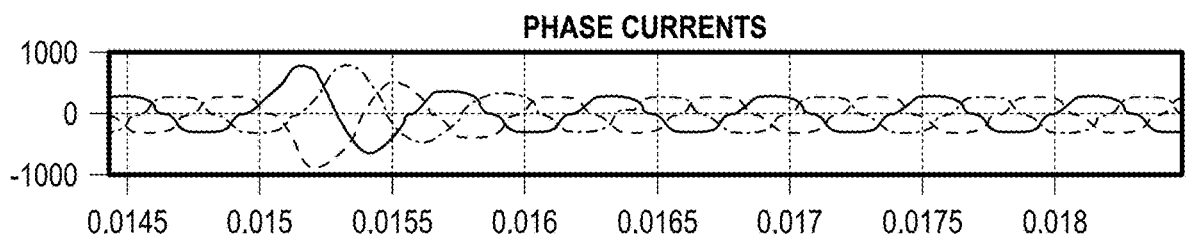
FIGS. 5a-5f show various currents and voltages in the system of FIG. 3 before and after a ground fault occurs in one of the positive DC connectors of the system with the addition of the fault clearing source.
Figure 5B:
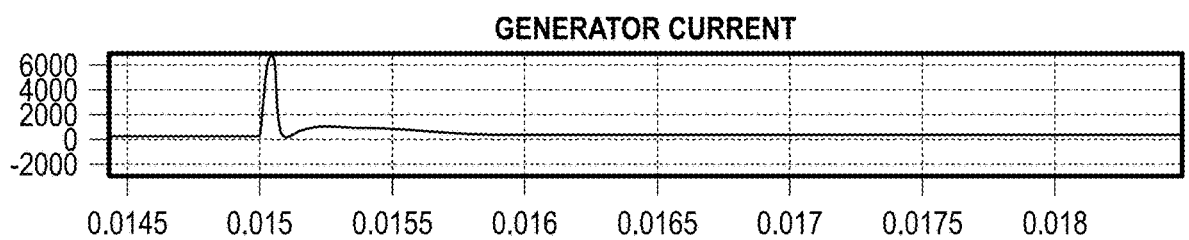
Figure 5C:
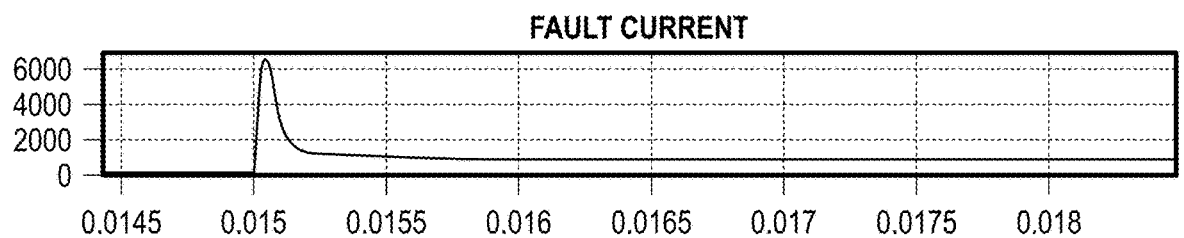
Figure 5D:
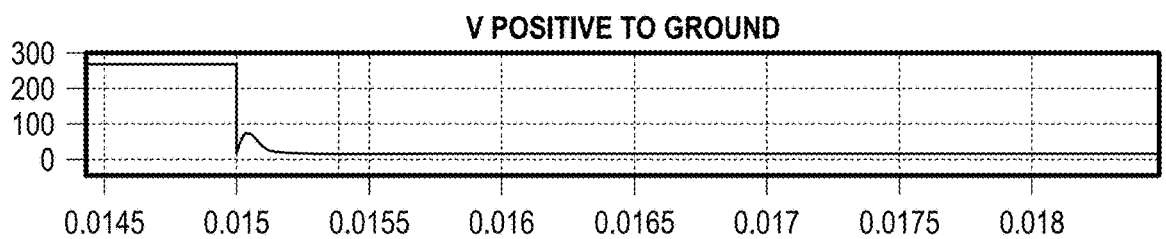
Figure 5E:
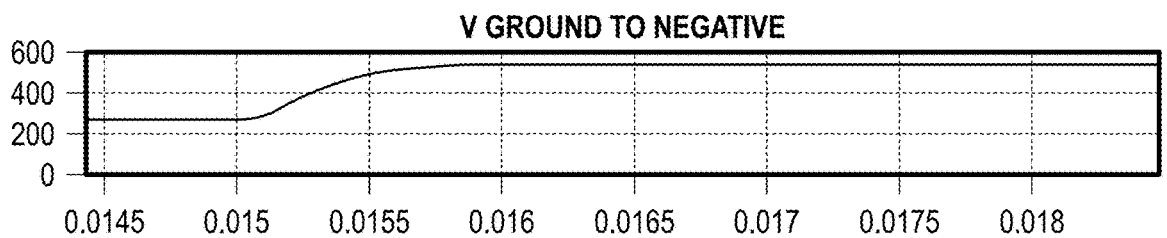
Figure 5F:
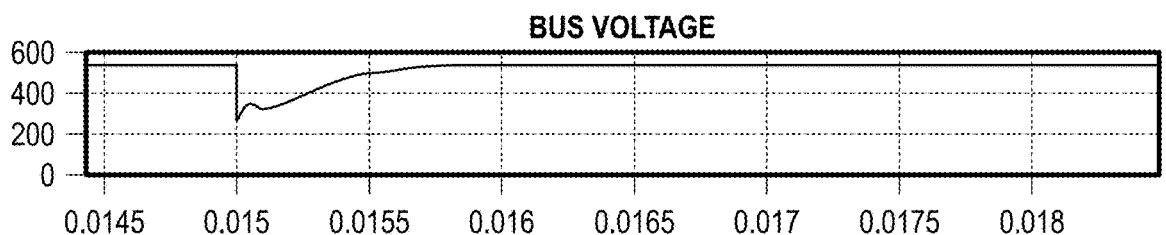

The first fault clearing source can be, for example, a DC power source such as a battery, a DC power source that is connected to one of both connectors 110, 112 or a DC power source connected to other connectors to name but a few. When the fault occurs, the voltage provided by the first fault clearing source 350 will be higher than the voltage on the first connector. As such, this voltage differential will allow for conduction of current through the current blocking device 352 and through the fault 140 allow for clearing of the fault. However, in the absence of fault, the voltage on first connector 110 will be higher than the voltage provided by the first fault clearing source 350. Thus, the current blocking device 352 will not allow current to pass from the first fault clearing source 350 to the first connector 110 and, thus, essentially isolate the first fault clearing source 350 from the first connector. The various voltage/current are shown in FIGS. 5a-5f for system where the first fault clearing source 350 provides a non-zero fault clearing current after the fault occurs to clear the fault as illustrated in FIG. 5c.

As illustrated, the first fault clearing source 350 is connected directly to the cathode of the diode utilized as the current blocking device 352 and the anode of the diode utilized as the current blocking device 352 is directly contacted to the positive connector 110. Other elements could be connected between these elements unless a direct connection is specifically required.

The fault clearing source 350 can provide a voltage of between 10 and 100 and between 10 and 20 volts in one embodiment. As shown, the fault clearing source 350 is connected to both connectors 110, 112. These connections 110a, 112a are shown in dashed to indicate that either or both is optional. In one embodiment, the fault clearing source 350 is utilized to clear a fault on a specific connector and, thus, receives power from the other conductor.

Figure 6:
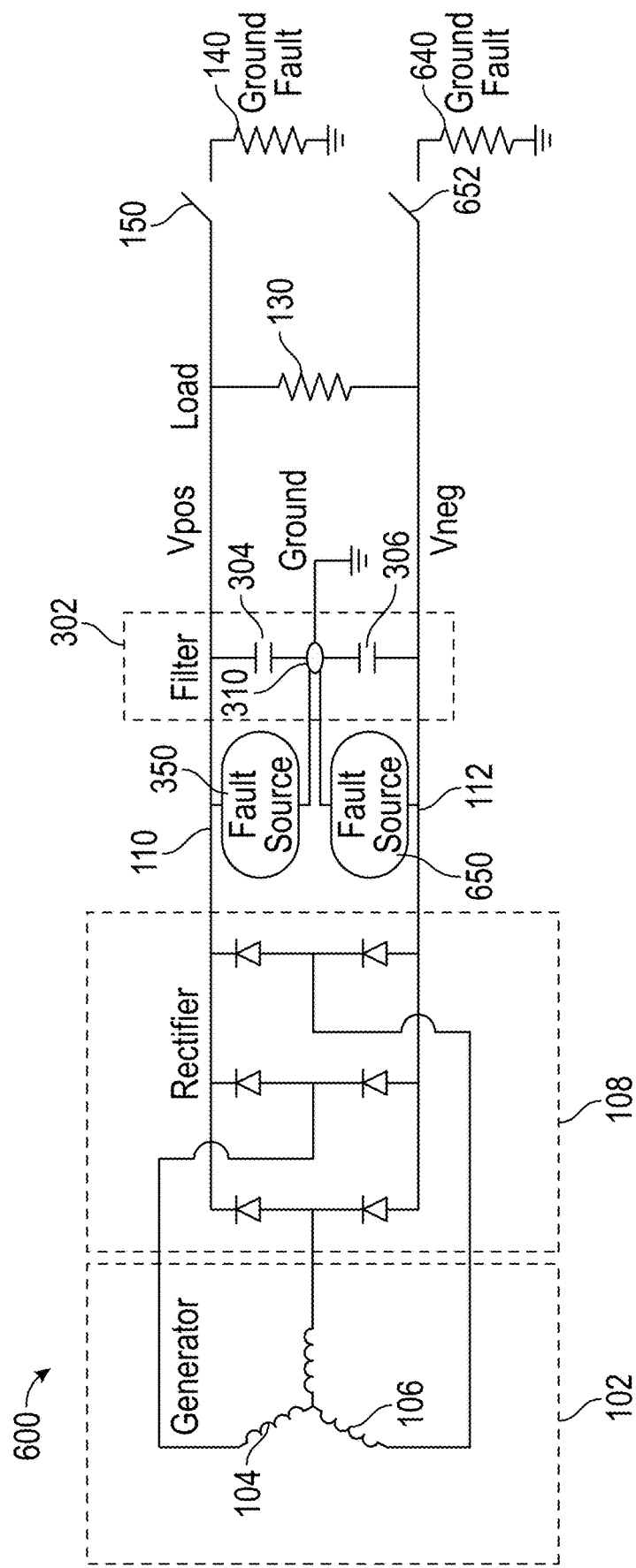
FIG. 6 depicts a system that includes a filter that has its midpoint grounded and includes fault clearing sources connected to each system DC connectors according to one embodiment.

As shown in FIG. 6, the system 600 can include a separate fault clearing source for each connector. In more detail, a first fault clearing source 350 is connected to the first connector 110 to clear a first fault 140 thereon and a second fault clearing source 650 is connected to the second connector 112 to clear a second fault 640 thereon using, for example, contactor 652. While not illustrated, current blocking devices such as diodes can be provided as shown in FIG.

3 between the fault clearing sources 350, 650 and the connector the sources are to clear.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The present embodiments may be a system, a method, and/or a computer program product at any possible technical detail level of integration. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device.

Aspects of the present invention are described herein with reference to flowchart illustrations and/or block diagrams of methods, apparatus (systems), and computer program products according to embodiments. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions, combinations, sub-combinations, or equivalent arrangements not heretofore described, but which are commensurate with the scope of the present disclosure. Additionally, while various embodiments of the present disclosure have been described, it is to be understood that aspects of the present disclosure may include only some of the described embodiments.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A power supply system to provide power to a load connected between first and second connectors, the system comprising:
   a generator that produces an alternating current generator output;
   a rectifier that receives the alternating current generator output and converts it into a direct current output and provides the direct current (DC) output between the first and second connectors;
   a filter connected to the rectifier and between the connectors and that smooths the DC output, the filter including a midpoint configured to be connected to ground;
   a fault clearing source connected to the first connector that provides a clearing voltage to the first connector when a ground fault occurs on the first connector; and
   a contactor connected to the first connector that can open and close to clear the fault while the fault clearing source is providing the clearing voltage to the first connector.

2. The power supply system of claim 1, wherein the fault clearing source is a battery.

3. The power supply system of claim 1, wherein the fault clearing source receives power from the second connector.

4. The power supply system of claim 1, further comprising:
   a current blocking device connected between the fault clearing source and the first connector, the current blocking device blocking a flow of current from the fault clearing source to the first connector before the ground fault occurs.

5. The power supply system of claim 4, wherein the current blocking device is a diode.

6. The power supply of claim 1, wherein the output filter includes two capacitors and the midpoint is between the two capacitors.

7. The power supply system of claim 6, wherein the ground is external to the generator.

8. The power supply system of claim 7, wherein the ground is an airframe ground.

9. A power supply system to provide power to a load connected between first and second connectors, the system comprising:
   a generator that produces an alternating current generator output;
   a rectifier that receives the alternating current generator output and converts it into a direct current output and provides the direct current (DC) output between the first and second connectors;
   a filter connected to the rectifier and between the connectors and that smooths the DC output, the filter including a midpoint configured to be connected to ground;
   a fault clearing source connected to the first connector that provides a clearing voltage to the first connector when a ground fault occurs on the first connector;
   a current blocking device connected between the fault clearing source and the first connector, the current blocking device blocking a flow of current from the fault clearing source to the first connector before the ground fault occurs, wherein the current blocking device is a diode; and a contactor connected to the first connector that can open and close to clear the fault while the fault clearing source is providing the clearing voltage to the first connector.

10. A power supply system to provide power to a load connected between first and second connectors, the system comprising:

a generator that produces an alternating current generator output;

a rectifier that receives the alternating current generator output and converts it into a direct current output and provides the direct current (DC) output between the first and second connectors;

a filter connected to the rectifier and between the connectors and that smooths the DC output, the filter including a midpoint configured to be connected to ground;

a fault clearing source connected to the first connector that provides a clearing voltage to the first connector when a ground fault occurs on the first connector;

a current blocking device connected between the fault clearing source and the first connector, the current blocking device blocking a flow of current from the fault clearing source to the first connector before the ground fault occurs; and a contactor connected to the first connector that can open and close to clear the fault while the fault clearing source is providing the clearing voltage to the first connector.

\* \* \* \* \*